_(12)_ United States Patent
Im et al.

(10) Patent No.: US 9,537,490 B2
(45) Date of Patent: Jan. 3, 2017

(54) DUTY CYCLE DETECTION CIRCUIT AND SEMICONDUCTOR APPARATUS INCLUDING THE SAME

(71) Applicant: SK hynix Inc., Icheon-si Gyeonggi-do (KR)

(72) Inventors: Da In Im, Icheon-si (KR); Young Suk Seo, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 49 days.

(21) Appl. No.: 14/625,970

(22) Filed: Feb. 19, 2015

(65) Prior Publication Data

US 2016/0182060 A1    Jun. 23, 2016

(30) Foreign Application Priority Data

Dec. 22, 2014   (KR) ................. 10-2014-0186088

(51) Int. Cl.
*H03L 7/06*    (2006.01)
*H03L 7/08*    (2006.01)
*H03K 5/156*   (2006.01)

(52) U.S. Cl.
CPC ............ *H03L 7/08* (2013.01); *H03K 5/1565* (2013.01)

(58) Field of Classification Search
None
See application file for complete search history.

(56) References Cited

U.S. PATENT DOCUMENTS

| 8,368,447 B1* | 2/2013 | Chou | H03L 7/0812 327/149 |
| 2007/0262798 A1* | 11/2007 | Yun | H03L 7/07 327/158 |
| 2011/0273211 A1* | 11/2011 | Chang | H03K 5/1565 327/175 |
| 2012/0212286 A1* | 8/2012 | Yokou | H02M 1/00 327/537 |
| 2013/0049832 A1* | 2/2013 | Wong | H03K 3/017 327/159 |
| 2013/0249612 A1* | 9/2013 | Zerbe | H04L 7/0079 327/161 |

FOREIGN PATENT DOCUMENTS

| KR | 100903371 B1 | 6/2009 |
| KR | 101232922 B1 | 2/2013 |

* cited by examiner

*Primary Examiner* — Cassandra Cox
(74) *Attorney, Agent, or Firm* — William Park & Associates Ltd.

(57) ABSTRACT

A duty cycle detection circuit may include a detection block configured to generate a duty detection signal by detecting a duty cycle of an input clock; and a current amount control block configured to control a current flowing through the detection block in response to the input clock, regardless of a variation in a frequency of the input clock.

21 Claims, 6 Drawing Sheets

DUTY CYCLE DETECTION CIRCUIT AND SEMICONDUCTOR APPARATUS INCLUDING THE SAME

CROSS-REFERENCES TO RELATED APPLICATION

The present application claims priority under 35 U.S.C. §119(a) to Korean application number 10-2014-0186088 filed on Dec. 22, 2014, in the Korean Intellectual Property Office, which is incorporated herein by reference in its entirety.

BACKGROUND

1. Technical Field

Embodiments generally relate to a semiconductor apparatus, and more particularly, in one or more embodiments, to a duty cycle detection circuit and a semiconductor apparatus including the same.

2. Related Art

A synchronous semiconductor apparatus may be synchronized with a system bus. To put it another way, a synchronous semiconductor apparatus has a synchronous interface maintaining a fixed timing relationship between the synchronous semiconductor apparatus and another apparatus in the system, which is supposed to receive data outputted from the synchronous semiconductor apparatus, so that the data-receiving device can capture the data. A synchronous semiconductor apparatus uses a clock signal which is distributed throughout the system. Clock skew, however, occurs because the clock signal must be distributed using many transmission lines and transistors. Modern synchronous-communication systems with high data transmission rates may use delay-locked loop ("DLL") circuits or phase-locked loop ("PLL") to minimize data transmission errors due to clock skew.

Also, a semiconductor apparatus may include a duty cycle detection circuit for detecting the duty of a clock signal.

The duty cycle detection circuit may detect the duty cycle of the clock signal, that is, the ratio of a rising period and a falling period.

SUMMARY

Various embodiments are directed to a duty cycle detection circuit capable of stably detecting a duty cycle regardless of a frequency of an input clock signal, and a semiconductor apparatus including the same.

In an embodiment, a duty cycle detection circuit may include: a detection block configured to generate a duty detection signal by detecting a duty of an input clock; and a current amount control block configured to control a current amount of the detection block in response to the input clock, regardless of a variation in a frequency of the input clock.

In an embodiment, a duty cycle detection circuit may include: a rising clock detection block configured to detect a rising clock in response to a first control signal; a falling clock detection block configured to detect a falling clock in response to a second control signal which has an activation timing different from the first control signal; a comparison block configured to output a duty detection signal by comparing an output signal of the rising clock detection block and an output signal of the falling clock detection block in response to a comparison enable signal; and a current amount control block configured to control current amounts of the rising clock detection block and the falling clock detection block in response to the rising clock and the falling clock, regardless of variations in frequencies of the rising clock and the falling clock.

In an embodiment, a semiconductor apparatus may include: a delay-locked loop circuit block configured to detect a phase difference of an input clock and a feedback clock, and generate a delay-locked clock; a duty correction block configured to correct a duty of the delay-locked clock in response to a duty control signal, and output a corrected clock; a duty control signal generation block configured to generate the duty control signal in response to a duty detection signal; and a duty cycle detection circuit configured to generate the duty detection signal by detection a duty of the input clock, and control current amounts of current paths in response to the input clock, regardless of a variation in a frequency of the input clock.

DETAILED DESCRIPTION

Figure 1:
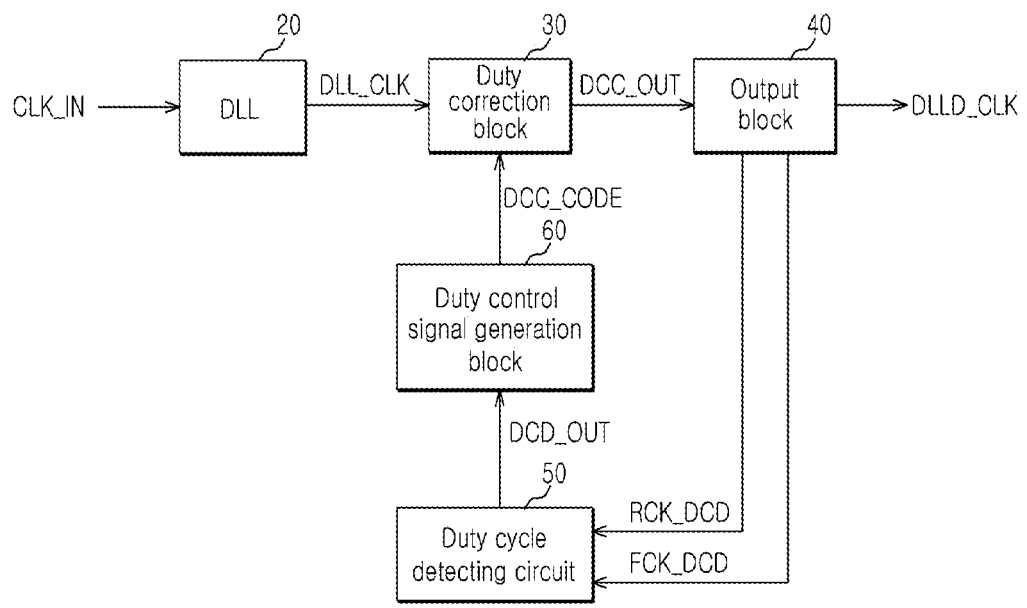
FIG. 1 is a block diagram illustrating a configuration example of a semiconductor apparatus in accordance with an embodiment.

Illustrated in FIG. 1 is a semiconductor apparatus implementing the principles.

Referring to FIG. 1, a semiconductor apparatus 10 in accordance with an embodiment may include a DLL circuit block 20, a duty correction block 30, an output block 40, a duty cycle detection circuit 50, and a duty control signal generation block 60.

The DLL circuit block 20 may detect the phase difference between a reference clock and a feedback clock. The DLL circuit block 20 may generate a delay-locked clock DLL_CLK by delaying the reference clock by the amount of delay, which is set with respect to a delay line. Here, the amount of delay may be adjusted by setting the delay line.

The duty correction block 30 may correct the duty cycle of the delay-locked clock DLL_CLK in response to a duty control signal DCC_CODE, and output a corrected clock DCC_OUT.

The output block 40 may generate an output clock DLL-D_CLK by amplifying the corrected clock DCC_OUT, and generate a corrected rising clock RCK_DCD and a corrected falling clock FCK_DCD as the differential forms of the output clock DLLD_CLK.

The duty cycle detection circuit 50 may receive the corrected rising block RCK_DCD and the corrected falling clock FCK_DCD from the output block 40, detect the duty cycles of the corrected rising clock RCK_DCD and the corrected falling clock FCK_DCD during the activation periods of first and second control signals Strobe_R and Strobe_F (e.g., a rising strobe signal and a falling strobe signal), and output a detection result as a duty detection signal DCC_OUT.

The duty control signal generation block 60 may generate the duty control signal DCC_CODE in response to the duty detection signal DCC_OUT during the activation periods of the first and second control signals Strobe_R and Strobe_F.

Figure 2:
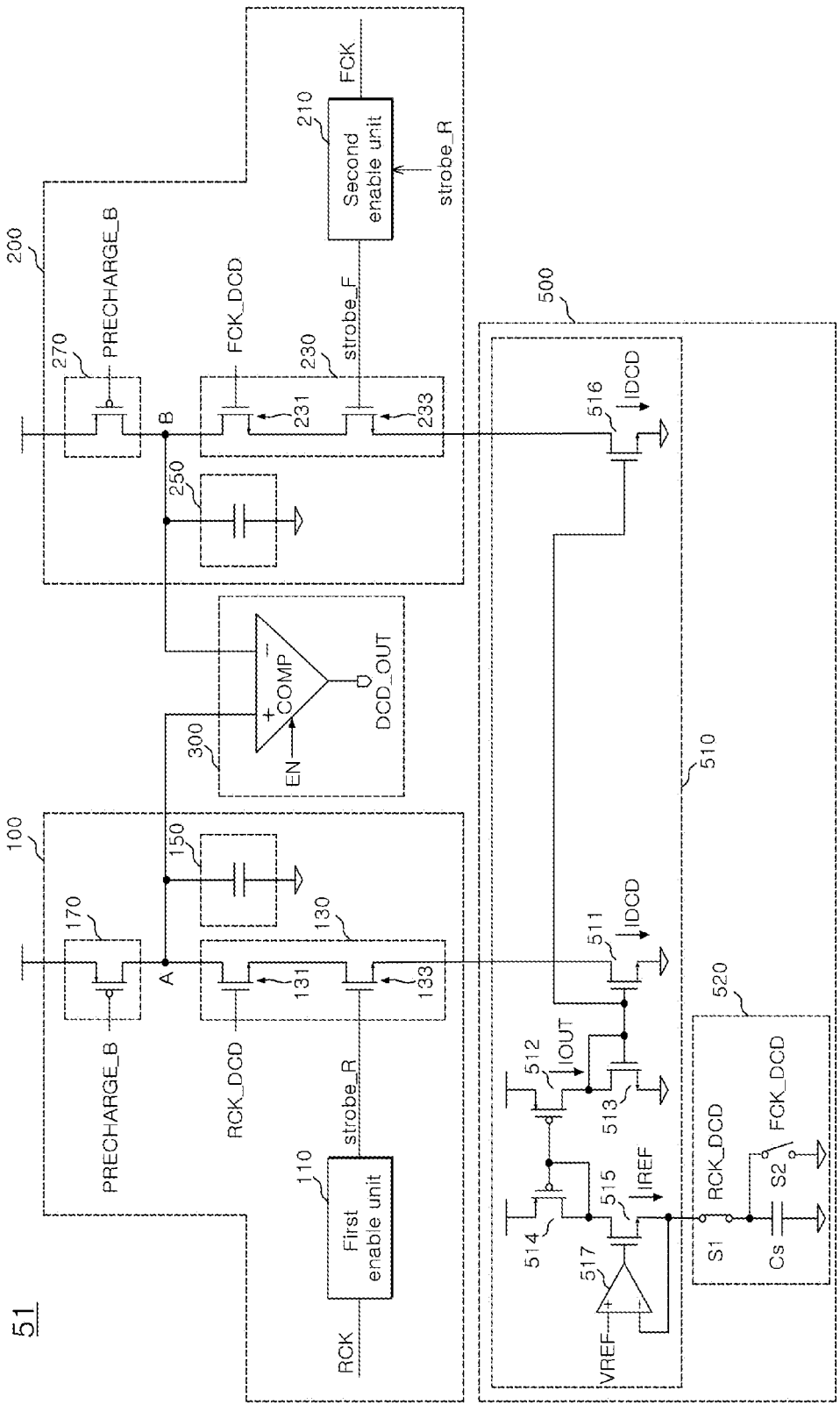
FIG. 2 is a circuit diagram illustrating a configuration example of a duty cycle detection circuit in accordance with an embodiment.

Illustrated in FIG. 2 is a duty cycle detection circuits implementing the principles.

Referring to FIG. 2, a duty cycle detection circuit 51 in accordance with an embodiment may include a first detection block 100, a second detection block 200, a comparison block 300, and a current amount control block 500.

The first detection block 100 may include a first enable unit 110, a rising clock detection unit 130, a first storage unit 150, and a first precharge unit 170.

The first enable unit 110 may generate a first control signal Strobe_R in synchronization with a rising clock RCK.

The rising clock detection unit 130 may change the voltage of the first storage unit 150 (e.g., the voltage between a node of the first storage unit 150 and a reference voltage) according to the number of corrected rising clocks RCK_DCD which are to be detected during an activation period of the first control signal Strobe_R.

The rising clock detection unit 130 may include a first transistor 131 and a second transistor 133. The first storage unit 150 may include a capacitor. The first transistor 131 may discharge the capacitor of the first storage unit 150 in response to the corrected rising clock RCK_DCD. As a result, the voltage of a first node A may decrease. The second transistor 133 may be electrically coupled to the first transistor 131, and may discharge the capacitor of the first storage unit 150 in response to the first control signal Strobe_R when the first transistor 131 is also enabled.

The first precharge unit 170 may precharge the first storage unit 150.

The second detection block 200 may include a second enable unit 210, a falling clock detection unit 230, a second storage unit 250, and a second precharge unit 270.

The second enable unit 210 may generate the second control signal Strobe_F by using the first control signal Strobe_R and a falling clock signal FCK. For example, the second enable unit 210 may generate the second control signal Strobe_F by using the first control signal Strobe_R and a falling clock bar signal FCKB, which is inverted from the falling clock signal FCK.

The second control signal Strobe_F may be a signal for controlling an operation period of the falling clock detection unit 230 to prevent a falling clock, which is to be detected (e.g., the corrected falling clock FCK_DCD) from being cut off.

The falling clock detection unit 230 may change the voltage of the second storage unit 250 (e.g., the voltage between a node of the second storage unit 250 and a reference voltage) according to the number of corrected falling clocks FCK_DCD which are to be detected during an activation period of the second control signal Strobe_F.

The falling clock detection unit 230 may include a third transistor 231 and a fourth transistor 233. The second storage unit 250 may include a capacitor. The third transistor 231 may discharge the capacitor of the second storage unit 250 in response to the corrected falling clock FCK_DCD. As a result, the voltage of a second node B may decrease. The fourth transistor 233 may be electrically coupled to the third transistor 231, and may discharge the capacitor of the second storage unit 250 in response to the second control signal Strobe_F when the third transistor 231 is also enabled.

The comparison block 300 may compare the output signals of the first detection block 100 and the second detection block 200 in response to a comparison enable signal EN, and output the duty detection signal DCD_OUT.

The comparison enable signal EN may be set to be activated after the activation periods of the first and second control signals Strobe_R and Strobe_F.

The comparison unit 300 may compare the voltage of the first storage unit 150 and the voltage of the second storage unit 250, that is, the voltages of the first node A and the second node B in response to the comparison enable signal EN, and output the duty detection signal DCD_OUT. Each of the first and second storage units 150 and 250 may include a capacitor. The comparison unit 300 may compare the voltage levels of the first and second storage units 150 and 250, and output the duty detection signal DCD_OUT according to the voltage difference between the first and second storage units 150 and 250. The first storage unit 150 may be precharged by the first precharge unit 170, which may include a PMOS transistor and may be enabled in response to a precharge signal PRECHARGE_B. Similarly, the second storage unit 250 may be precharged by the second precharge unit 270, which may include a PMOS transistor and may be enabled in response to the precharge signal PRECHARGE_B.

The current amount control block 500 may control current per an operation cycle of detection blocks (e.g., the first detection block 100 and the second detection block 200) regardless of variations in the frequencies of input clocks (e.g., the corrected rising clock RCK_DCD and the corrected falling clock FCK_DCD).

The current amount control block 500 may control the current flowing through the duty cycle detection circuit 51 in response to the corrected rising clock RCK_DCD and the corrected falling clock FCK_DCD.

The current amount control block 500 may control the current flowing through the duty cycle detection circuit 51 by changing the resistance values of current paths of the first detection block 100 and the second detection block 200 according to the corrected rising clock RCK_DCD and the corrected falling clock FCK_DCD.

The current amount control block 500 may include a current mirror 510, and a variable resistor unit 520.

The variable resistor unit 520 may have variable resistance, which may change in response to the corrected rising clock RCK_DCD and the corrected falling clock FCK_DCD.

The variable resistor unit 520 may include a switched capacitor resistor.

The variable resistor unit 520 may include first and second switches S1 and S2 and a capacitor Cs.

The first switch S1 may be electrically coupled to a fifth transistor 515.

The capacitor Cs and the second switch S2 may be electrically coupled in parallel between a ground terminal and the first switch S1.

The first switch S1 may electrically connect the current mirror 510 to the ground terminal through the capacitor Cs in response to the corrected rising clock RCK_DCD.

The second switch S2 may electrically connect the current mirror 510 to the ground terminal in response to the corrected falling clock FCK_DCD.

The current mirror 510 may control the current flowing through the first detection block 100 and the second detection block 200 according to a change in the resistance value of the variable resistance unit 520.

The current mirror 510 may include first to sixth transistors 511 to 516 and a comparator 517.

The first transistor 511 as a first current source may be electrically coupled between the first detection block 100 and the ground terminal.

The second and third transistors 512 and 513 may be electrically coupled between a power supply terminal and the ground terminal, and the gate of the third transistor 513 is electrically coupled to the gate of the first transistor 511.

The fourth and fifth transistors 514 and 515 may be electrically coupled between the power supply terminal and the ground terminal, and the gate of the fourth transistor 514 is electrically coupled to the gate of the second transistor 512.

The sixth transistor 516 as a second current source may be electrically coupled between the second detection block 200 and the ground terminal.

The comparator 517 may control the voltage level of the gate of the fifth transistor 515 according to a result of comparing a reference voltage VREF and the voltage level of the source of the fifth transistor 515.

Figure 3:
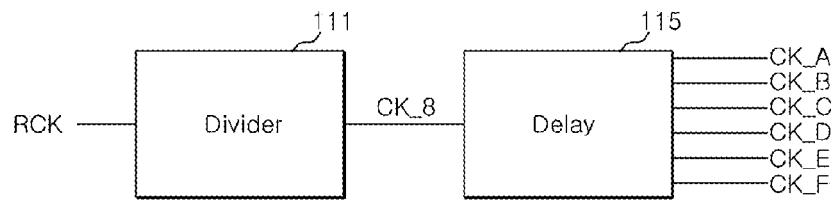
FIG. 3 is a block diagram illustrating a configuration example of the first enable unit shown in FIG. 2.
Figure 3:
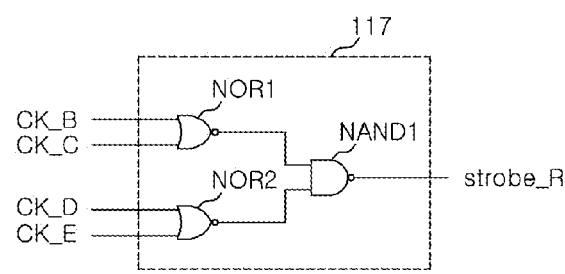

Referring to FIG. 3, the first enable unit 110 may include a divider 111 and a delay 115.

Figure 5:
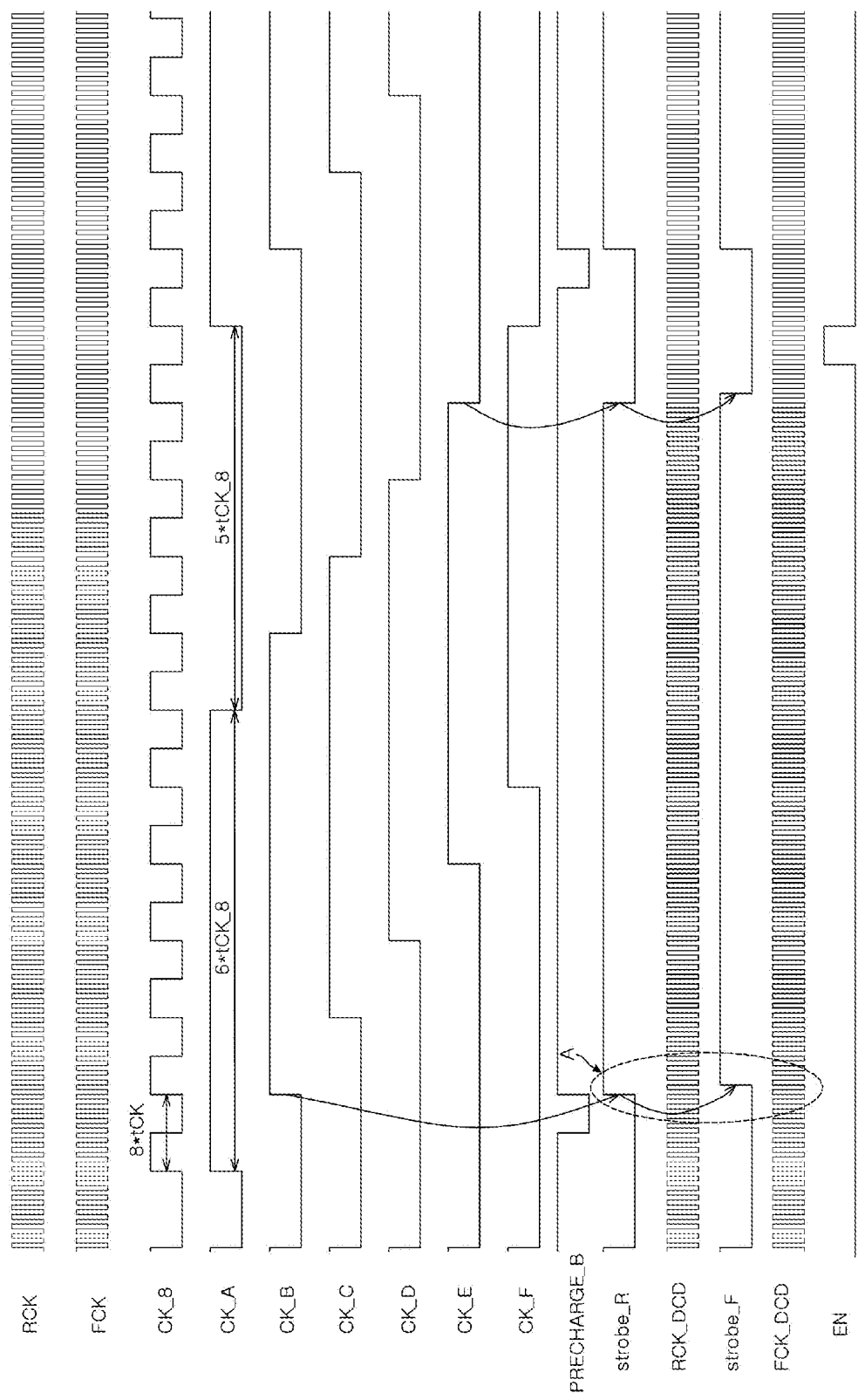
FIG. 5 is an example of an operation timing diagram to assist in the explanation of the operations of the duty cycle detection circuit in accordance with an embodiment.

The divider 111 may receive the rising clock RCK, divide the received rising clock RCK, and generate a divided clock. For example, the divider 111 may receive the rising clock RCK, divide the received rising clock RCK by 8, and generate a divided clock CK_8. The divided clock CK_8 may be inputted to the delay 115 to generate a plurality of delayed clocks CK_A, CK_B, CK_C, CK_D, CD_E and CK_F. As illustrated in FIG. 5, the plurality of delayed clocks CK_A, CK_B, CK_C, CK_D, CD_E and CK_F may have different delay amounts.

A part of the plurality of delayed clocks, for example, the delayed clocks CK_B, CK_C, CK_D and CD_E may be inputted to a logic circuit block 117, and the logic circuit block 117 may generate the first control signal Strobe_R by performing a predetermined logical operation on the inputted clocks CK_B, CK_C, CK_D and CK_E. The logic circuit block 117 may include a first NOR gate NOR1, a second NOR gate NOR2, and a NAND gate NAND1. The first NOR gate NOR1 may receive and perform a NOR operation on the delayed clocks CK_B and CK_C, the second NOR gate NOR2 may receive and perform a NOR operation on the delayed clocks CK_D and CK_E, and the NAND gate NAND1 may perform a NAND operation on the output signals of the first and second NOR gates NOR1 and NOR2, and generate the first control signal Strobe_R.

Figure 4:
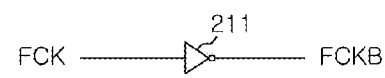
FIG. 4 is a block diagram illustrating a configuration example of the second enable unit shown in FIG. 2.
Figure 4:
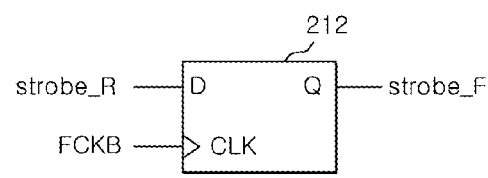

Referring to FIG. 4, the second enable unit 210 may generate the second control signal Strobe_F by using the first control signal Strobe_R and the falling clock bar signal FCKB. For example, the second enable unit 210 may include an inverter 211 which inverts the falling clock signal FCK and generates the falling clock bar signal FCKB, and a D flip-flop which receives the first control signal Strobe_R and the falling clock bar signal FCKB as input signals. As described above, the second control signal Strobe_F may be generated based on the falling clock FCK and the first control signal Strobe_R. For example, the second control signal Strobe_F may be a signal which is generated by shifting the activation period of the first control signal Strobe_R such that the number of the high pulses of corrected falling clocks FCK_DCD are the same as the number of the high pulses of corrected rising clocks RCK_DCD. The second control signal Strobe_F may have the same activation time as the first control signal Strobe_R, but have a different activation timing. In other words, the first control signal Strobe_R may be set to have an activation period that corresponds to n times the number of rising clocks (e.g., n times the number of the high pulses of rising clocks, n is an integer), and the second control signal Strobe_F may be set to have an activation period that corresponds to n times the number of falling clocks (e.g., n times the number of the high pulses of falling clocks), whereby the occurrence of a clock cutoff phenomenon may decrease.

The duty cycle detection circuit 51 according to an embodiment may detect the duty cycle of the corrected rising clock RCK_DCD in response to the first control signal Strobe_R having a first activation period, and detect the duty cycle of the corrected falling clock FCK_DCD in response to the second control signal Strobe_F having a second activation period different from the first activation period.

Figure 6:
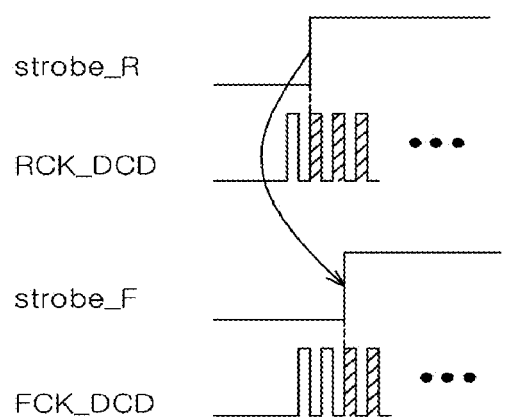
FIG. 6 is an enlarged timing diagram for the part A of FIG. 5.

As illustrated in FIGS. 5 and 6, the activation timing of the second control signal Strobe_F may be set to be different from the activation timing of the first control signal Strobe_R, such that the high pulse cutoff phenomenon of the corrected falling clock FCK_DCD is prevented. Under the same high pulse condition, the duty cycles of the corrected rising clock RCK_DCD and the corrected falling clock FCK_DCD may be measured.

Also, as illustrated in FIG. 5, the comparison enable signal EN may be set to be activated after the activation periods of the first and second control signals Strobe_R and Strobe_F. The duty cycle detection circuit 50 according to an embodiment may separately perform the detection operation, and the comparing operation for the corrected rising clock RCK_DCD and the corrected falling clock FCF_DCD. Therefore, it is possible to additionally reduce or minimize a duty offset that may occur as the detection operation and the comparing operation are performed simultaneously.

Figure 7:
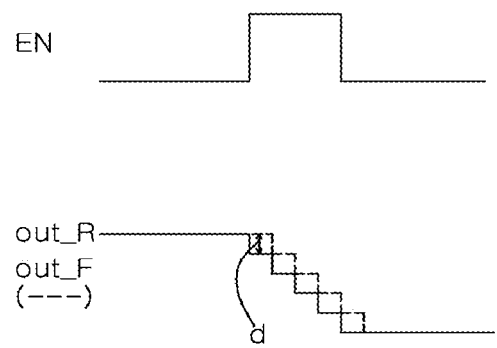
FIG. 7 is an example of an operation timing diagram to assist in the explanation of the comparing operation of the duty cycle detection circuit in accordance with an embodiment.

As illustrated in FIG. 7, a duty cycle comparison operation may be performed by detecting a difference d between an output voltage out_R of the first node A and an output voltage out_F of the second node B during the activation period of the comparison enable signal EN. A duty cycle distortion may be detected by a change in the difference d, which is a difference between the output voltage out_R of the coupling node A and the output voltage out_F of the second node B.

According to an embodiment, the duty cycle of the corrected rising clock RCK_DCD may be detected in response to the first control signal Strobe_R having the first activation period and the duty cycle of the corrected falling clock FCK_DCD may be detected in response to the second control signal Strobe_F having the second activation period different from the first activation period. Accordingly, it is possible to precisely detect a duty cycle. Furthermore, the duty cycle detection circuit may separately perform the detection operation and the comparing operation, and therefore a duty offset may be reduced or minimized.

$$Q_D = R * T * I_{DCD} = R * \frac{I_{DCD}}{f_{CK}} \qquad \text{[Equation 1]}$$

$Q_D$: discharge amount per a cycle in DCD
$f_{CK}$: input clock frequency
R: duty ratio
K: constant (1, 2, . . . , n)

$$R_S = \frac{1}{C_S * f_{CK}} \quad \text{[Equation 2]}$$

$$I_{DCD} = K * I_{OUT} = K * I_{REF} = \quad \text{[Equation 3]}$$
$$K * \frac{V_{REF}}{R_S} = K * \frac{V_{REF}}{(C_S * f_{CK})^{-1}} = K * V_{REF} * C_S * f_{CK}$$

$$Q_D = R * T * I_{DCD} = \quad \text{[Equation 4]}$$
$$R * \frac{I_{DCD}}{f_{CK}} = \frac{R}{f_{CK}} * K * V_{REF} * C_S * f_{CK} = R * K * V_{REF} * C_S$$

In the duty cycle detection circuit 51 according to an embodiment, the duty cycle detection operation may be performed by the current amount control block 500 regardless of the frequencies of input clocks, e.g., the rising clock RCK and the falling clock FCK.

Referring to FIG. 2 and the above equations, in the duty cycle detection circuit 51, a discharge amount $Q_D$, which is an amount of charge $Q_D$ being discharged during one cycle of an input clock, e.g., the rising clock RCK and the falling clock FCK, may be expressed as in Equation 1.

In Equation 1, T is a cycle and equals $1/f_{CK}$.

The discharge amount $Q_D$ may be inversely proportional to the frequency of the input clock.

Accordingly, the discharge amount $Q_D$ may vary according to the frequency of the input clock, and the offset of the duty cycle detection circuit 51 may increase.

A variable resistance value $R_S$ of the current amount control block 500 may be expressed as in Equation 2.

The amounts of current flowing through the first and second current sources, that is, the first transistor 511 and the sixth transistor 516 of the current mirror 510 of the duty cycle detection circuit 51 are the same as $I_{DCD}$.

$I_{DCD}$ may be expressed as in Equation 3. When considering Equation 3, the discharge amount $Q_D$ of an input clock for one cycle may be expressed as in Equation 4.

As expressed in Equation 4, the discharge amount $Q_D$ may have a value that is regardless of the frequency $f_{CK}$ of the input clock.

Accordingly, since the duty cycle detection circuit 51, which include the current amount control block 500 according to an embodiment, may operate regardless of the frequencies of input clocks, a duty offset may decrease, and a precise duty cycle detection operation may be possible.

Figure 8:
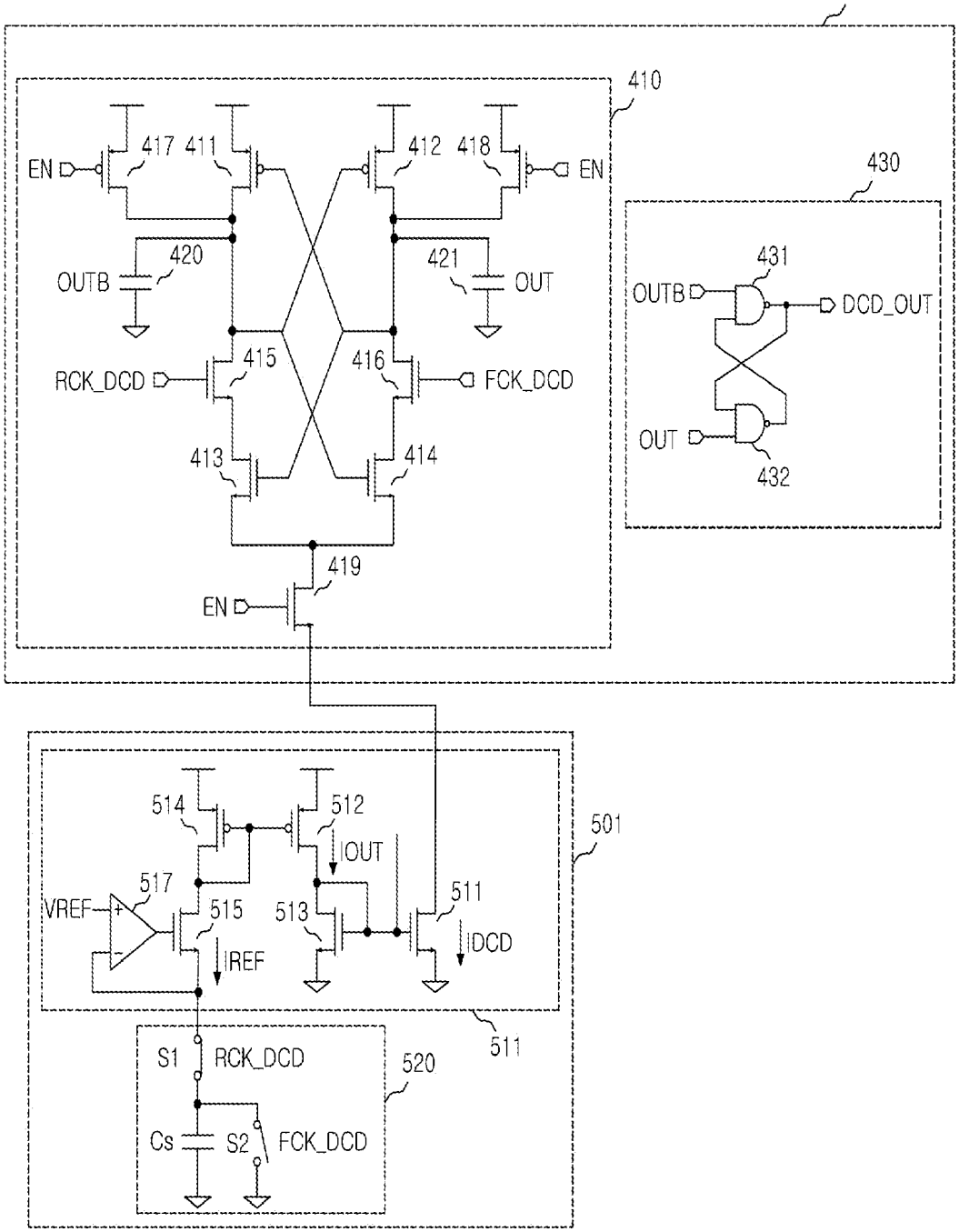
FIG. 8 is a circuit diagram illustrating a configuration example of a duty cycle detection circuit in accordance with an embodiment.

Referring to FIG. 8, a duty cycle detection circuit 52 in accordance with an embodiment may include a detection block 400 and a current amount control block 501.

The detection block 400 may generate a duty detection signal DCD_OUT in response to input clocks, e.g., a corrected rising clock RCK_DCD and a corrected falling clock FCK_DCD during the activation period of an enable signal EN.

The detection block 400 may include a current conversion unit 410 and an output unit 430.

The current conversion unit 410 may generate a differential output signal OUT/OUTB by controlling an amount of charge being discharged according to the voltages of the corrected rising clock RCK_DCD and the corrected falling clock FCK_DCD during the activation period of the enable signal EN.

The current conversion unit 410 may include first to ninth transistors 411 to 419, and first and second capacitors 420 and 421.

The first to sixth transistors 411 to 416 may form a cross-coupled latch, and the seventh to ninth transistors 417 to 419 may form a current path extending from a power supply terminal to a ground terminal according to the enable signal EN.

The first and second capacitors 420 and 421 may be discharged so that the voltage level, which has been raised by a precharge operation before the activation of the enable signal EN, decreases according to the operations of the first to ninth transistors 411 to 419, and the voltage level difference between them may be outputted as the differential output signal OUT/OUTB.

The output unit 430 may generate the duty detection signal DCD_OUT in response to the differential output signal OUT/OUTB.

The output unit 430 may include an SR latch, and first and second logic gates 431 and 432.

The first logic gate 431 may perform a NAND operation on the differential output signal OUTB and the output of the second logic gate 432, and output the duty detection signal DCD_OUT.

The second logic gate 432 may perform a NAND logic function on the output of the first logic gate 431 and the differential output signal OUT, and output a resultant signal.

The current amount control block 501 may control current per an operation cycle of the duty cycle detection circuit 52 regardless of variations in the frequencies of input clocks, e.g., the corrected rising clock RCK_DCD and the corrected falling clock FCK_DCD.

The current amount control block 501 may control the current flowing through the duty cycle detection circuit 52 in response to the corrected rising clock RCK_DCD and the corrected falling clock FCK_DCD.

The current amount control block 501 may control the current flowing through the duty cycle detection circuit 52 by changing a resistance value thereof according to the corrected rising clock RCK_DCD and the corrected falling clock FCK_DCD.

The current amount control block 501 may include a current mirror 511 and a variable resistance unit 520.

The current amount control block 501 of the duty cycle detection circuit 52 in accordance with an embodiment may be configured in the same manner as the current amount control block 500 of FIG. 2 except that one current source is used.

The current mirror 511 of the current amount control block 501 may include first to fifth transistors 511 to 515 and a comparator 517, and may be configured in such a manner as the current mirror 510 of FIG. 2 implemented without the sixth transistor 516.

Therefore, descriptions for the detailed configuration of the current amount control block 501 will be omitted herein.

In the duty cycle detection circuit 52 in accordance with an embodiment, as described above with reference to Equation 1 to Equation 4, the duty cycle detection operation may be performed regardless of the frequencies of input clocks, e.g., the corrected rising clock RCK_DCD and the corrected falling clock FCK_DCD.

Accordingly, since the duty cycle detection circuit 52 according to an embodiment operates regardless of the frequencies of input clocks due to the operation of the current amount control block 501, a duty offset may decrease, and a precise duty cycle detection operation may be possible.

While various embodiments have been described above, it will be understood to those skilled in the art that the embodiments described are by way of example only. Accordingly, the duty cycle detection circuit and the semiconductor apparatus including the same described herein should not be limited based on the described embodiments.

What is claimed is:

1. A duty cycle detection circuit comprising:
   a detection block configured to generate a duty detection signal by detecting a duty cycle of an input clock; and
   a current amount control block configured to control a current flowing through the detection block in response to the input clock regardless of a variation in a frequency of the input clock.

2. The duty cycle detection circuit according to claim 1, wherein the current amount control block is configured to change a resistance value of a current path of the detection block in response to the input clock.

3. The duty cycle detection circuit according to claim 1, wherein the current amount control block comprises:
   a variable resistance unit configured to change a resistance value thereof in response to the input clock; and
   a current mirror configured to control the current flowing through the detection block according to a change in the resistance value of the variable resistance unit.

4. The duty cycle detection circuit according to claim 1, wherein the current amount control block comprises:
   a current mirror configured to control the current flowing through the detection block according to a change in the resistance value of the current path; and
   a variable resistance unit configured to change the resistance value of the current path by changing a capacitance thereof in response to the input clock.

5. A duty cycle detection circuit comprising:
   a rising clock detection block configured to detect a rising clock in response to a first control signal;
   a falling clock detection block configured to detect a falling clock in response to a second control signal which has an activation timing different from the first control signal;
   a comparison block configured to output a duty detection signal by comparing an output signal of the rising clock detection block and an output signal of the falling clock detection block in response to a comparison enable signal; and
   a current amount control block configured to control a current flowing through the rising clock detection block and the falling clock detection block in response to the rising clock and the falling clock regardless of variations in frequencies of the rising clock and the falling clock.

6. The duty cycle detection circuit according to claim 5, further comprising:
   a first enable unit configured to generate the first control signal based on the rising clock.

7. The duty cycle detection circuit according to claim 6, wherein the first enable unit comprises:
   a divider configured to receive the rising clock and generate a divided clock;
   a delay configured to receive the divided clock and generate a plurality of delayed clocks; and
   a logic circuit block configured to generate the first control signal by performing a logical operation on some of the plurality of delayed clocks.

8. The duty cycle detection circuit according to claim 6, further comprising:
   a second enable unit configured to generate the second control signal based on the first control signal and the falling clock.

9. The duty cycle detection circuit according to claim 5, wherein the comparison enable signal is configured to be activated after activation periods of the first and second control signals.

10. The duty cycle detection circuit according to claim 5, wherein the current amount control block is configured to change resistance values of current paths of the rising clock detection block and the falling clock detection block in response to the rising clock and the falling clock.

11. The duty cycle detection circuit according to claim 5, wherein the current amount control block comprises:
    a variable resistance unit configured to change a resistance value thereof in response to the rising clock and the falling clock; and
    a current mirror configured to control the current flowing through the rising clock detection block and the falling clock detection block according to a change in the resistance value of the variable resistance unit.

12. The duty cycle detection circuit according to claim 5, wherein the current amount control block comprises:
    a current mirror configured to control the current flowing through the rising clock detection block and the falling clock detection block according to changes in the resistance values of the current paths; and
    a variable resistance unit configured to change the resistance value of the current path by changing capacitance thereof in response to the rising clock and the falling clock.

13. A semiconductor apparatus comprising:
    a delay-locked loop circuit block configured to detect a phase difference of an input clock and a feedback clock, and generate a delay-locked clock;
    a duty correction block configured to correct a duty of the delay-locked clock in response to a duty control signal, and output a corrected clock;
    a duty control signal generation block configured to generate the duty control signal in response to a duty detection signal; and
    a duty cycle detection circuit configured to generate the duty detection signal by detecting a duty cycle of the corrected clock, and control current flowing through current paths in response to the corrected clock regardless of a variation in a frequency of the input clock.

14. The semiconductor apparatus according to claim 13, wherein the duty cycle detection circuit comprises:
    a rising clock detection block configured to detect a rising clock in response to a first control signal;
    a falling clock detection block configured to detect a falling clock in response to a second control signal which has an activation timing different from the first control signal;
    a comparison block configured to output the duty detection signal by comparing an output signal of the rising clock detection block and an output signal of the falling clock detection block in response to a comparison enable signal; and
    a current amount control block configured to control current flowing through the rising clock detection block and the falling clock detection block in response to the rising clock and the falling clock regardless of variations in frequencies of the rising clock and the falling clock.

15. The semiconductor apparatus according to claim 14, further comprising:

a first enable unit configured to generate the first control signal based on the rising clock.

16. The semiconductor apparatus according to claim 15, wherein the first enable unit comprises:
   a divider configured to receive the rising clock and generate a divided clock;
   a delay configured to receive the divided clock and generate a plurality of delayed clocks; and
   a logic circuit block configured to generate the first control signal by performing a logical operation on some of the plurality of delayed clocks.

17. The semiconductor apparatus according to claim 15, further comprising:
   a second enable unit configured to generate the second control signal based on the first control signal and the falling clock.

18. The semiconductor apparatus according to claim 14, wherein the current amount control block is configured to change resistance values of current paths of the rising clock detection block and the falling clock detection block in response to the rising clock and the falling clock.

19. The semiconductor apparatus according to claim 14, wherein the current amount control block comprises:
   a variable resistance unit configured to change a resistance value thereof in response to the rising clock and the falling clock; and
   a current mirror configured to control the current flowing through the rising clock detection block and the falling clock detection block according to a change in the resistance value of the variable resistance unit.

20. The semiconductor apparatus according to claim 14, wherein the current amount control block comprises:
   a current mirror configured to control the current flowing through the rising clock detection block and the falling clock detection block according to changes in the resistance values of the current paths; and
   a variable resistance unit configured to change the resistance value of the current path by changing a capacitance thereof in response to the rising clock and the falling clock.

21. The semiconductor apparatus according to claim 13, wherein the duty cycle detection circuit comprises:
   a detection block configured to generate the duty detection signal by detecting the duty cycle of the corrected clock; and
   a current amount control block configured to control the current flowing through the detection block constantly in response to the corrected clock regardless of the variation in the frequency of the input clock.

* * * * *